United States Patent
Bräunlich et al.

(10) Patent No.: US 7,944,084 B2
(45) Date of Patent: May 17, 2011

(54) PERIPHERAL MODULE AND PERIPHERAL SYSTEM FOR AN AUTOMATION SYSTEM

(75) Inventors: Michael Bräunlich, Chemnitz (DE);
Stefan Dausend, Schwabach (DE)

(73) Assignee: Siemens Aktiengesellschaft, Munich (DE)

( * ) Notice: Subject to any disclaimer, the term of this patent is extended or adjusted under 35 U.S.C. 154(b) by 238 days.

(21) Appl. No.: 12/215,606

(22) Filed: Jun. 26, 2008

(65) Prior Publication Data

US 2009/0002904 A1    Jan. 1, 2009

(30) Foreign Application Priority Data

Jun. 26, 2007  (EP) ..................................... 07012467

(51) Int. Cl.
*H02J 3/00*  (2006.01)
(52) U.S. Cl. ................ 307/29; 307/36; 307/61; 307/63; 361/67; 361/192; 361/193
(58) Field of Classification Search .................. 361/192, 361/193, 67; 307/29, 36, 61, 63
See application file for complete search history.

(56) References Cited

U.S. PATENT DOCUMENTS

| | | | |
|---|---|---|---|
| 4,772,806 A * | 9/1988 | Lean et al. ....................... 307/38 |
| 5,708,589 A | 1/1998 | Beauvais | |
| 6,873,063 B1 * | 3/2005 | Appleford et al. ............ 307/149 |
| 7,411,319 B2 * | 8/2008 | Suhara et al. .................. 307/326 |
| 2007/0255429 A1 * | 11/2007 | Hauf .............................. 700/19 |

FOREIGN PATENT DOCUMENTS

| | | |
|---|---|---|
| DE | 4402002 A1 | 7/1995 |
| EP | 0 236 711 A2 | 9/1987 |
| EP | 1 493 960 A2 | 1/2005 |

OTHER PUBLICATIONS

WAGO Gesamtkatalog W4, Bd. 3, "Komponenten für die Automatisierung WAGOI/O-System Interface Bausteine", Chapter 1, Jan. 19, 2005, p. 153.
Phoenix Contact IB IL 24 SEG (-PAC) "Inline-Segmentklemme ohne Sicherung", Data sheet 5566_DE_03 from Mar. 2007, pp. 1-5, (Download under www.download.phoenixcontact.de).
Rockwell Automation ".I/O 24 Vdc Expansion Power Supply", Publication 1734-IN 058 D-En-P, Jun. 2005, pp. 1-20, /Download unter http://literature.rockwelluatomation.com/idc/groups/literature/documents/in/1734-in058_/en-p.pdf).

* cited by examiner

*Primary Examiner* — Hal I Kaplan

(57) ABSTRACT

There is described a peripheral module which in addition to the connection terminals for the process data supply has connection terminals for the supply of voltage. Furthermore, the peripheral module has a changeover switching device to disconnect the peripheral module from an upstream load group. The peripheral module can assume the function of a supply group or a power module when a supply voltage is applied to the terminals. In a peripheral system made of several peripheral modules the voltage within a load group is supplied via an internal self-constructing voltage bus.

11 Claims, 1 Drawing Sheet

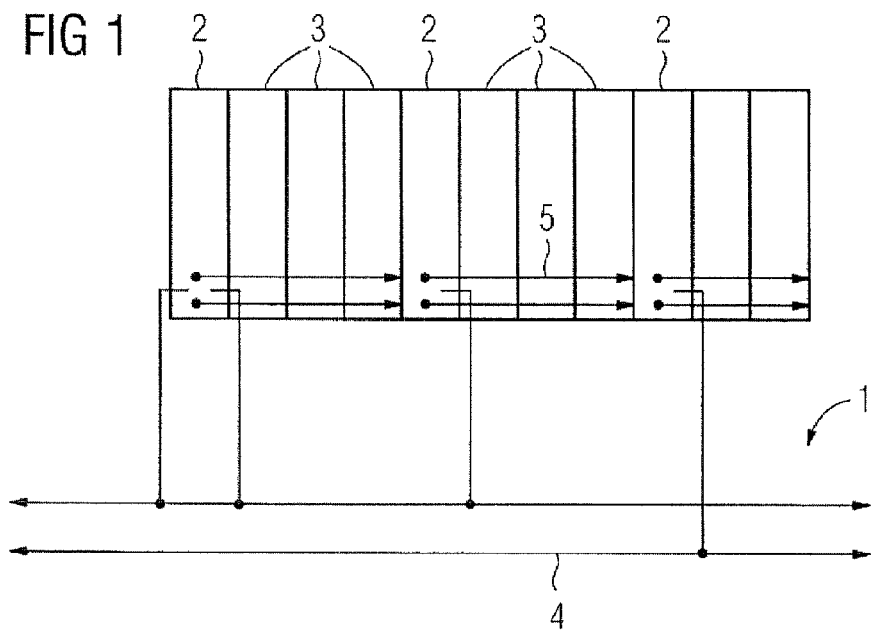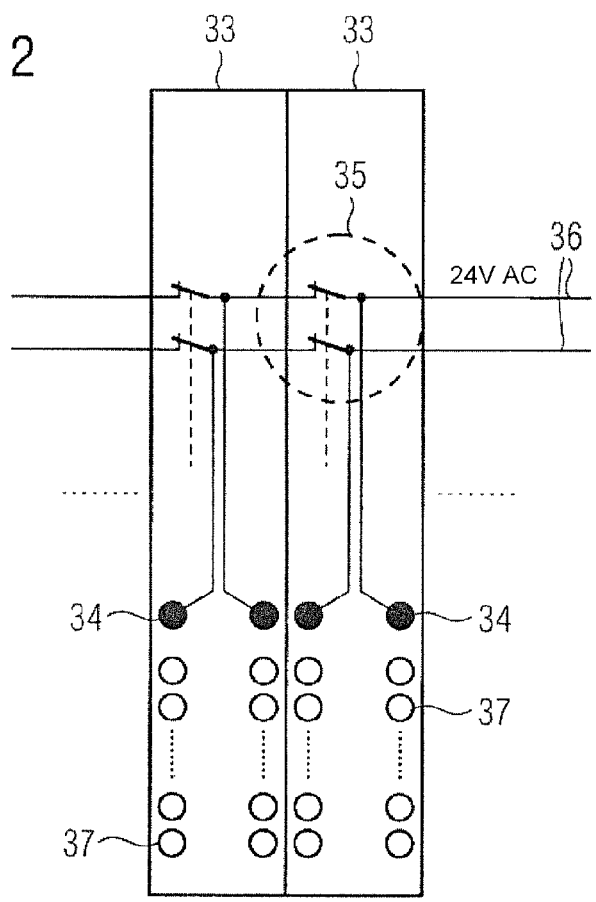

PERIPHERAL MODULE AND PERIPHERAL SYSTEM FOR AN AUTOMATION SYSTEM

CROSS REFERENCE TO RELATED APPLICATIONS

This application claims priority of European Patent Office application No. 07012467.2 EP filed Jun. 26, 2007, which is incorporated by reference herein in its entirety.

FIELD OF INVENTION

The invention relates to a peripheral module for an automation system and a peripheral system for an automation system.

BACKGROUND OF INVENTION

In automation systems individual peripheral modules or peripheral assemblies are frequently merged to form so-called load groups. Such load groups are supplied with a supply voltage via a power supply unit. The formation of load groups which can be individually and specifically switched off and on enables a high degree of flexibility when connecting various users within the automation system. Moreover, with the formation of several load groups independently supplied with a supply voltage a diagnosis can be performed more easily in the event of a fault. In addition, the formation of load groups which can be specifically switched off in the context of a fault ensures the most efficient implementation possible, for example of an EMERGENCY-OFF function.

As a rule, so-called power modules or supply modules are available for selective load group formation. These power modules supply several peripheral modules or assemblies with the required supply voltage, which is 24 V as standard in the context of an automation system. The power modules and the respective peripheral modules connected to them, which form a common load group, are inserted into consecutive slots within the rack. A power module together with the subsequent peripheral modules forms a potential group independent of the other groups. As a rule, self-constructing internal voltage buses are used for individual load group formation within the modular peripheral systems. The voltage buses serve to supply voltage to the peripheral modules belonging to a load group. The power module also ensures that the voltage bus of the previous load group is disconnected from the voltage bus of the following load group and that the following load group only receives its supply voltage via the power module. However, power modules which ensure a power supply must be again and again inserted between the various peripheral assemblies which are connected with data technology via their connections to the different users of the automation system, and which therefore fulfill the actual automation tasks. On the one hand, slots are required on the rack, and on the other hand, when planning the automation system the number of peripheral modules which are to form a load group should be considered from the outset. In a subsequent reconfiguration of the system it may then be necessary to remove the individual peripheral assemblies from the rack and rearrange them so that a newly required supply module can be inserted between them.

SUMMARY OF INVENTION

An object of the present invention is to supply peripheral modules with the necessary supply voltage more flexibly.

The object is achieved by a peripheral module for an automation system, with means for receiving a supply voltage from an upstream peripheral module and for relaying the supply voltage to a downstream peripheral module, with a connection device for the supply of voltage from a power supply unit and with a changeover switching device to interrupt the relaying of the supply voltage to the downstream peripheral module.

The invention is based on the understanding that through the option of equipping each peripheral module with a connection option for supply voltage from a power supply unit and at the same time creating the opportunity for the supply voltage, which as a rule is transmitted via the voltage buses between the individual peripheral modules, to be interrupted by means of a changeover switching device so that subsequent peripheral modules are disconnected from the supply voltage, the simple and flexible formation of load groups can be made possible. Implementation is simple, for example, in that each peripheral module has so-called supply terminals via which the supply voltage is supplied from the power supply unit to the peripheral module. The voltage is then relayed via internal self-constructing voltage buses to all subsequent peripheral modules, with each individual peripheral module itself being able to have connection terminals and a corresponding changeover switching device again. The desired number of peripheral modules for the corresponding load group can then be simply compiled by the operator of the automation system by adjusting the changeover switching device of the next peripheral module after the last peripheral module required for the load group in such a way that the subsequent peripheral modules are disconnected from the corresponding supply voltage of the previous load group. The assembly or the peripheral module on which the changeover switching device is activated then assumes, when a supply voltage is re-applied via the terminals, the function of the supply assembly or the power module.

In this way, special power modules or supply modules can be saved. This results in a smaller footprint on the rack and at the same time, greater flexibility both during planning and subsequent alteration of the load groups. By activating the changeover switch or the changeover switching device, additional peripheral modules can easily be added to a load group or disconnected from it. The series of peripheral modules connected in series can be divided into different load groups of whichever size required flexibly, quickly and simply using the system according to the invention, while other peripheral modules or assemblies can assume the function of a power module and flexible disconnection of subsequent load groups is enabled by the switchover. As a rule, 24V is supplied as standard from the power supply units, as is the usual standard for automation systems nowadays. In parts of the automation systems supply voltages other than 24V are also used. Different supply voltages can also be mixed within an automation system.

Overall, the use of peripheral modules according to the invention in a peripheral system of an automation system makes possible economical implementation of a decentralized peripheral of an automation system. In addition, with the peripheral module according to the invention it is advantageous that a lower number of different components needs to be produced, stored, ordered and managed.

BRIEF DESCRIPTION OF THE DRAWINGS

Hereinafter the invention is explained in detail on the basis of the figures.

FIG. 1 shows a diagram of a peripheral system according to the prior art.

FIG. 2 shows a diagram of peripheral modules with connection and changeover switching device.

DETAILED DESCRIPTION OF INVENTION

FIG. 1 shows a peripheral system 1 within an automation system according to the prior art. The individual peripheral modules or peripheral assemblies 3 are supplied with the supply voltage 4 via so-called supply or power modules 2. One supply module 2 and the subsequent peripheral modules 3 on the rack form a so-called load group. In the event of a fault, for example, they are switched off together. A new supply module then forms the start of a subsequent load group again. The supply voltage between the individual peripheral modules of a load group is usually provided via self-constructing internal voltage buses 5. The supply module here ensures both the supply of the corresponding load group with the necessary supply voltage and on the other hand, by means of the supply module, disconnection from the next respective load group is realized.

FIG. 2 shows two peripheral modules 33 or peripheral assemblies which in addition to the process terminals 37 have a connection device 34 for the supply of a supply voltage from a power supply unit. In the simplest scenario the connection device 34 is in the form of two connection or supply terminals. Furthermore, the peripheral module has a changeover switching device 35. Relaying of supply voltage between peripheral modules in series 33 takes place via the means 36 for receiving a supply voltage from an upstream peripheral module and for relaying the supply voltage to a downstream peripheral module. As a rule, these are embodied as self-constructing internal voltage buses.

Via the connection device 34 a voltage supply, for example from a power supply unit, can now be applied to a peripheral module. If the changeover switching devices 35 of downstream peripheral modules are closed, the supply voltage is relayed via the self-constructing internal voltage buses 36 to the downstream peripheral modules of the respective load group. If subsequent peripheral modules 33 are to be disconnected from the load group, then by simply working the changeover switching device 35, for example by opening the switch shown in FIG. 2, the subsequent peripheral modules can be disconnected. These then form a new load group if the first peripheral module 33 receives a supply voltage via the connection device 34 again. By means of the switch 35 the voltage buses can thus be disconnected from the adjacent peripheral modules on the left and a new voltage bus group or a load group can thus be set up.

Integrating the functionality of a supply module into the normal peripheral module, which is also described as a connection terminal module, produces multiple benefits. Within the decentralized peripheral system a lower footprint is required as a result of the removal of the supply module or the power module. As a result of the option of simply throwing the switch in the changeover switching device 35 a flexible configuration of the respective load groups is possible. Each peripheral module 33 has the option of assuming the functional task of the supply module in a traditional peripheral system and thus supplying a load group with the supply voltage and at the same time enabling disconnection from the preceding load group. The smaller number of components required also makes storage more economical.

The invention claimed is:

1. A peripheral module for an automation system, comprising:
    a receiving device to receive a supply voltage from an upstream peripheral module;
    a relaying device relaying the supply voltage to a downstream peripheral module;
    a connection device for the supply of a supply voltage from a power supply unit; and
    a changeover switching device to interrupt the relaying of supply voltage to the downstream peripheral module, wherein the downstream peripheral module is disconnected from the supply voltage when the changeover switching device interrupts the relaying of the supply voltage to the downstream peripheral module.

2. The peripheral module as claimed in claim 1, wherein the receiving device has self-constructing internal voltage buses.

3. The peripheral module as claimed in claim 2, wherein the changeover switching device disconnects the voltage buses of downstream peripheral modules.

4. The peripheral module as claimed in claim 3, wherein the connection device has two supply terminals for 24V alternating voltage.

5. The peripheral module as claimed in claim 2, wherein the connection device has two supply terminals for 24V alternating voltage.

6. The peripheral module as claimed in claim 1, wherein the changeover switching device disconnects the voltage buses of downstream peripheral modules.

7. The peripheral module as claimed in claim 6, wherein the connection device has two supply terminals for 24V alternating voltage.

8. The peripheral module as claimed in claim 1, wherein the connection device has two supply terminals for 24V alternating voltage.

9. The peripheral module as claimed in claim 1, further comprising inputs and outputs for receipt and transmission of automation data.

10. A method for using peripheral modules, comprising:
    providing a plurality of peripheral modules, wherein a module of the plurality of modules has a receiving device to receive a supply voltage from an upstream peripheral module, a relaying device to relay the supply voltage to a downstream peripheral module, a connection device to supply a supply voltage from a power supply unit, and a changeover switching device to interrupt the relaying of supply voltage to the downstream peripheral module;
    supplying downstream peripheral modules via a respective peripheral module with a supply voltage, the downstream modules forming one load group; and
    when desired to form a new load group with the downstream peripheral modules, disconnecting the downstream peripheral modules from the supply voltage via the respective peripheral module by interrupting with the changeover switching device the relaying of the supply voltage to the downstream peripheral modules.

11. A peripheral system for an automation system, comprising:
    a plurality of peripheral modules, wherein a module has
        a receiving device to receive a supply voltage from an upstream peripheral module,
        a relaying device relaying the supply voltage to a downstream peripheral module,
        a connection device for the supply of a supply voltage from a power supply unit, and
        a changeover switching device to interrupt the relaying of supply voltage to the downstream peripheral module;

at least one peripheral module being provided as a supply module for the provision of a supply voltage of downstream peripheral modules forming a load group; and at least one peripheral module being provided to disconnect downstream peripheral modules from the supply voltage by interrupting the relaying of the supply voltage, the downstream peripheral modules forming a new load group.

* * * * *